United States Patent
Sanchez et al.

(10) Patent No.: US 8,698,291 B2
(45) Date of Patent: Apr. 15, 2014

(54) PACKAGED LEADLESS SEMICONDUCTOR DEVICE

(75) Inventors: Audel A. Sanchez, Tempe, AZ (US); Fernando A. Santos, Chandler, AZ (US); Lakshminarayan Viswanathan, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 87 days.

(21) Appl. No.: 13/326,636

(22) Filed: Dec. 15, 2011

(65) Prior Publication Data
US 2013/0154068 A1    Jun. 20, 2013

(51) Int. Cl.
*H01L 23/02* (2006.01)

(52) U.S. Cl.
USPC .... 257/678; 257/666; 257/675; 257/E21.006; 257/E21.077; 257/E21.499; 257/E21.502; 257/E21.503; 257/E21.504; 257/E21.505; 257/E21.509; 257/E21.511

(58) Field of Classification Search
USPC ......... 257/666, 678, 675, 676, 689, 691, 699, 257/701, 706, 720, 728, 734, 784, 787, 791, 257/E21.006, E21.077, E21.499, E21.502, 257/E21.503, E21.504, E21.505, E21.509, 257/E21.511
See application file for complete search history.

(56) References Cited

U.S. PATENT DOCUMENTS

| | | | |
|---|---|---|---|
| 5,200,362 A | 4/1993 | Lin et al. | |
| 5,773,879 A | 6/1998 | Fusayasu et al. | |
| 6,083,811 A | 7/2000 | Riding et al. | |
| 6,247,229 B1 | 6/2001 | Glenn | |
| 6,309,909 B1 | 10/2001 | Ohgiyama | |
| 6,465,883 B2 | 10/2002 | Olofsson | |
| 6,534,849 B1 | 3/2003 | Gang | |
| 6,867,367 B2 * | 3/2005 | Zimmerman | 174/528 |
| 6,917,097 B2 | 7/2005 | Chow et al. | |
| 7,053,299 B2 * | 5/2006 | Zimmerman | 174/528 |
| 7,351,611 B2 * | 4/2008 | Yee et al. | 438/112 |
| 7,411,289 B1 | 8/2008 | McLellan et al. | |
| 7,445,967 B2 | 11/2008 | Abdo et al. | |
| 7,821,116 B2 | 10/2010 | Madrid | |
| 7,868,471 B2 | 1/2011 | Camacho et al. | |
| 7,989,951 B2 * | 8/2011 | Yeung et al. | 257/732 |
| 8,089,159 B1 | 1/2012 | Park et al. | |
| 8,115,305 B2 | 2/2012 | Camacho et al. | |

(Continued)

OTHER PUBLICATIONS

U.S. Appl. No. 13/484,664 filed May 31, 2012, entitled "System, Method and Apparatus for Leadless Surface Mounted Semiconductor Package".

(Continued)

*Primary Examiner* — David Nhu

(57) ABSTRACT

A packaged leadless semiconductor device (20) includes a heat sink flange (24) to which semiconductor dies (26) are coupled using a high temperature die attach process. The semiconductor device (20) further includes a frame structure (28) pre-formed with bent terminal pads (44). The frame structure (28) is combined with the flange (24) so that a lower surface (36) of the flange (24) and a lower section (54) of each terminal pad (44) are in coplanar alignment, and so that an upper section (52) of each terminal pad (44) overlies the flange (24). Interconnects (30) interconnect the die (26) with the upper section (52) of the terminal pad (44). An encapsulant (32) encases the frame structure (28), flange (24), die (26), and interconnects (30) with the lower section (54) of each terminal pad (44) and the lower surface (36) of the flange (24) remaining exposed from the encapsulant (32).

20 Claims, 7 Drawing Sheets

(56) References Cited

U.S. PATENT DOCUMENTS

| | | |
|---|---|---|
| 8,227,921 B1 | 7/2012 | Park et al. |
| 2003/0102537 A1 | 6/2003 | McLellan et al. |
| 2004/0011699 A1 | 1/2004 | Park |
| 2007/0178626 A1 | 8/2007 | Ismail et al. |
| 2007/0278701 A1 | 12/2007 | Chang et al. |
| 2008/0272475 A1 | 11/2008 | Dijkstra et al. |
| 2008/0308951 A1 | 12/2008 | Li et al. |
| 2009/0079050 A1 | 3/2009 | Steenbruggen et al. |
| 2010/0144101 A1 | 6/2010 | Chow et al. |
| 2011/0059579 A1 | 3/2011 | Eu et al. |
| 2012/0175784 A1 | 7/2012 | Lin et al. |
| 2012/0248626 A1 | 10/2012 | Lee et al. |

OTHER PUBLICATIONS

Non-Final Office Action mailed Apr. 29, 2013 for U.S. Appl. No. 13/484,664, 21 pages.

Final Office Action mailed Sep. 24, 2013 for U.S. Appl. No. 13/484,664, 17 pages.

\* cited by examiner

PACKAGED LEADLESS SEMICONDUCTOR DEVICE

TECHNICAL FIELD OF THE INVENTION

The present invention relates generally to semiconductor devices. More specifically, the present invention relates to leadless semiconductor devices.

BACKGROUND OF THE INVENTION

Semiconductor chips or dies (also typically referred to in plural as dice or die) are typically encapsulated in a semiconductor package for protection from damage by external stresses and to provide a system for carrying electrical signals to and from the chips. Many different types of semiconductor packages exist including dual-in-line packages, pin grid array packages, tape-automated bonding (TAB) packages, multi-chip modules (MCMs), and power packages. One type of power package is used for a high power semiconductor device that is capable of dissipating, for example, greater than thirty watts of power. Such a power package may be utilized in, for example, a radiofrequency application.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

Figure 1:
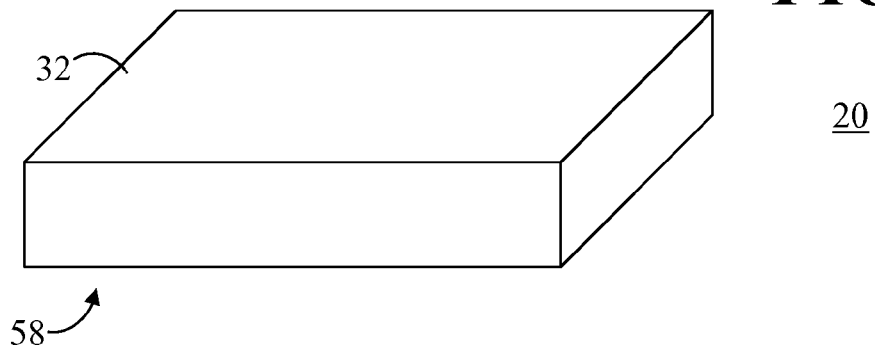
FIG. 1 shows a top perspective view of a semiconductor device in accordance with an embodiment.

There is an increasing trend to surface mount high power, e.g., greater than thirty watt, radiofrequency semiconductor devices directly onto circuit boards with embedded copper for grounding and thermal mounting. Such a surface mount technique may help to lower costs through standardized surface mount manufacturing processes. Presently, the leads of such surface mount packages are formed in a gull wing configuration that extend from the exterior sidewalls of the packaged semiconductor device and are bent in order to make contact with an underlying printed circuit board when surface mounted. Unfortunately, for high frequency applications, e.g., greater than three hundred megahertz (MHz), inductance in the gull wing leads lowers the system performance. Moreover, for high power applications, power distribution on the semiconductor device typically calls for a grid of power and ground lines to run across the device. This grid of power and ground lines further increases the line inductance causing unacceptable noise and further lowering system performance.

Leadless surface mount techniques are evolving to circumvent the problems associated with high inductance of the gull wing leads. In a leadless semiconductor device, a leadframe typically includes a die flange or paddle and terminal pads surrounding the die flange. One or more semiconductor dies are attached using, for example, epoxy or high temperature solder to the die flange, and the terminal pads are electrically interconnected with the semiconductor die or dies using a wire bonding process. These terminal pads are formed coplanar with the device backside in order to make contact with an underlying printed circuit board when surface mounted.

For high power applications, it is desirable to surface mount the one or more semiconductor dies of a semiconductor device using a robust, highly reliable die attach process, for example, a high temperature metallurgical bonding process such as gold-silicon bonding, gold-tin bonding, silver bonding, and so forth. Unfortunately, a high temperature bonding process is not a suitable for typical leadless surface mount packages containing multiple dies because the high temperature can cause warping of or otherwise damage the leadframe.

Embodiments described herein entail a leadless semiconductor device for high power applications and an assembly process for packaging the leadless semiconductor device. The semiconductor device includes a relatively thick heat sink flange and a separate frame structure. The frame structure is pre-formed with bent terminal pads. The semiconductor dies can be attached to the heat sink flange using a high temperature die attach process. The frame structure can subsequently be combined with the heat sink flange so that the lower surface of the heat sink flange and a portion of the terminal pads are in coplanar alignment. The structure can then be encapsulated in an encapsulant (such as a plastic material) so that the lower surface of the heat sink flange and the terminal pads remain exposed from the encapsulant.

Such a technique facilitates packaging flexibility and achieves improvements in wire bond quality. Furthermore, flatness of the packaged semiconductor device and coplanarity of the elements is maintained due to the relatively thick heat sink flange. Accordingly, a lower package with enhanced performance and improved reliability can be achieved for high power radiofrequency applications.

Figure 2:
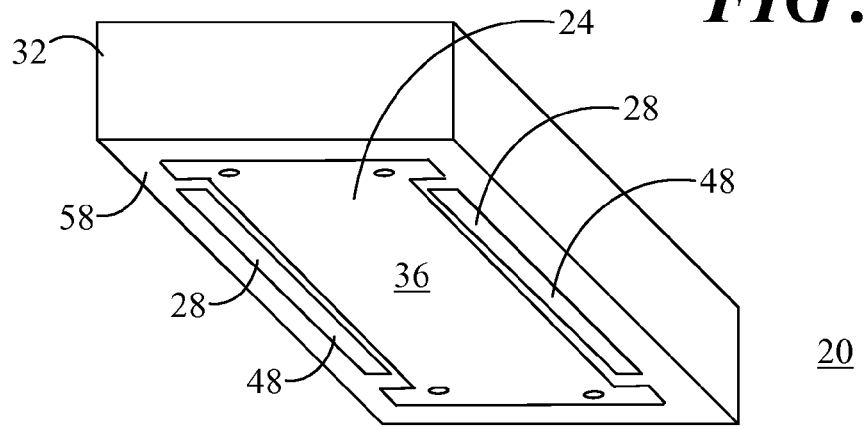
FIG. 2 shows a bottom perspective view of the semiconductor device of FIG. 1.
Figure 3:
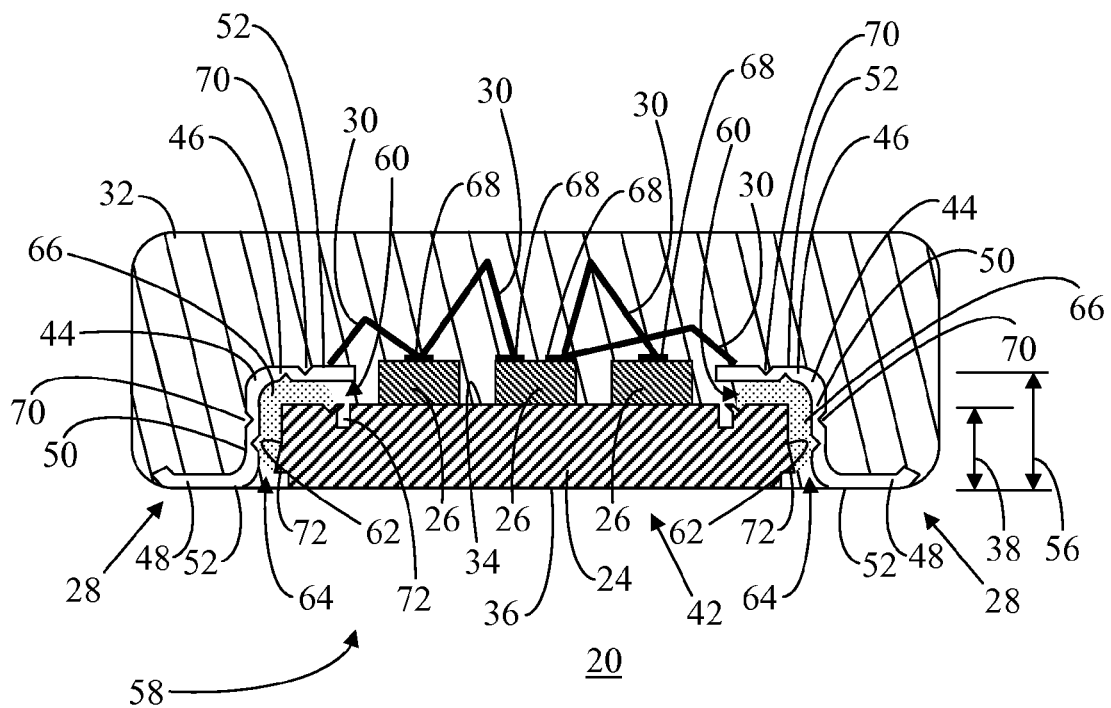
FIG. 3 shows a cross-sectional view of the semiconductor device of FIG. 1.

Referring to FIGS. 1-3, FIG. 1 shows a top perspective view of a semiconductor device 20 in accordance with an embodiment. FIG. 2 shows a bottom perspective view of semiconductor device 20, and FIG. 3 shows a cross-sectional view of semiconductor device 20. In general, semiconductor device 20 includes a heat sink flange 24, one or more semiconductor dies 26, a frame structure 28, and bond wires 30. Semiconductor device 20 is a leadless surface mount package in which the components of semiconductor device 20 are substantially encased in an encapsulant 32, such as a molding compound encapsulant.

For clarity of illustration, different shading and/or hatching is utilized in the following illustrations to distinguish the different elements of semiconductor device 20. In addition, a term "horizontal" may be used herein to define a plane parallel to the plane or surface of the semiconductor device 20, regardless of its orientation. Thus, a term "vertical" refers to a direction perpendicular to the horizontal as defined. Terms, such as "above," "below," "top," "bottom," "side" (as in "sidewall"), "upper," "lower," and so forth are defined with respect to the horizontal plane.

Heat sink flange 24 has an upper surface 34 and a lower surface 36 spaced apart from upper surface 34 by a flange thickness 38. Heat sink flange 24 may be thermally and electrically conductive copper or a copper laminate material. One or more semiconductor dies 26 are coupled to upper surface 34 of heat sink flange 24. In an embodiment, semiconductor dies 26 may be high power, e.g., greater than thirty watt, radiofrequency semiconductor dies that are attached to upper surface 34 of heat sink flange 24 using a high temperature bonding process, such as a gold-silicon eutectic bonding die attach process. In such an embodiment, flange thickness 38 of heat sink flange 24 may be of suitable thickness, for example, at least thirty mils, in order to withstand the high temperatures (e.g., greater than four hundred degree Celsius) needed for gold-silicon eutectic bonding without damage.

Frame structure 28 has a perimeter 40 (best seen in FIG. 7) defining a cavity 42 in which heat sink flange 24 resides. Frame structure 28 further includes terminal pads 44 surrounding at least a portion of cavity 42. In an embodiment, each of terminal pads 44 is a folded arrangement having a first section 46, a second section 48, and a connector section 50 interconnecting first and second sections 46 and 48, respectively. As shown, second section 48 is arranged approximately parallel to first section 46, and is outwardly laterally displaced away from heat sink flange 24 relative to first section 46.

A top side of first section 46 includes a surface, referred to herein as an upper surface 52, and an underside of second section 48 includes another surface, referred to herein as a lower surface 54. Upper and lower surfaces 52 and 54 are spaced apart by a distance 56 that is greater than flange thickness 38 of heat sink flange 24. Thus, heat sink flange 24 is positioned in cavity 42 such that lower surface 36 of heat sink flange 24 and lower surface 54 of each of terminal pads 44 are in coplanar alignment on an underside 58 of semiconductor device 20. Additionally, lower surface 36 of heat sink flange 24 and lower surface 54 of each of terminal pads 44 remain exposed from molding compound 32.

At least a portion of upper surface 52 of each of terminal pads 44 overlies upper surface 34 of heat sink flange 24. Additionally, first section 46 is spaced apart from upper surface 34 of heat sink flange 24 by a gap 60. Connector section 50 is oriented approximately perpendicular to first and second sections 46 and 48, respectively, and is spaced apart from lateral sidewalls 62 of heat sink flange 24 by another gap 64. The shape of terminal pads 44 and location of at least a portion of upper surface 52 of first section 46 overlying upper surface 34 of heat sink flange 24 enables bond wires 30 to be formed that are shorter than in prior art devices. Accordingly, lead inductance is lowered relative to prior art devices, thereby increasing system performance.

For simplicity of illustration, semiconductor device 20 is presented in FIG. 3 and some ensuing illustrations with bond wires 30 that appear sharply bent or kinked. Those skilled in the art will readily recognize that in practice bond wires 30 are not typically sharply bent, but are, instead, more likely to be curved or rounded. In addition, semiconductor device 20 is illustrated with two terminal pads 44 positioned on opposing sides of cavity 42. In alternative embodiments, frame structure 28 may include multiple terminal pads 44 at the two opposing sides of cavity 42 and/or multiple terminal pads 44 at one side of cavity 42 or any of multiple sides of cavity 42.

In an embodiment, gaps 60 and 64 may be filled with an electrically insulating dielectric material 66 such as, for example, a plastic material, glass, porcelain, and the like. Dielectric material 66 may be bonded between heat sink flange 24 and frame structure 28 prior to wire bonding. Dielectric material 66 is an electrical insulator that can be polarized by an applied electric field. Polarization of dielectric material 66 by the applied electric field can increase the capacitance between heat sink flange 24 and frame structure 28 to further enhance system performance.

Semiconductor dies 26 include die bond pads 68. Die bond pads 68 are electrically interconnected with upper surface 52 of terminal pads 44 in accordance with a particular design configuration by bond wires 30 using, for example, a wire bonding process. Such bond wires 30 and wire bonding processes are known by those skilled in the art. In an embodiment two mil gold wires may be utilized, and in another embodiment, ten mil aluminum wires may be used. However, various known wires of varying materials and diameters may be utilized in accordance with particular design requirements.

As mentioned briefly above, semiconductor device 20 includes molding compound encapsulant 30 that substantially encases the entirety of frame structure 28, heat sink flange 24, semiconductor dies 26, and bond wires 30. However, lower surface 36 of heat sink flange 24 and lower surface 54 of each of terminal pads 44 remain exposed. The exposed lower surface 36 and lower surfaces 54 are used to connect semiconductor device 20 to other devices, such as a printed circuit board (not shown). Accordingly, in addition to terminal pads 44, the exposed lower surface 36 may be a source terminal, e.g., ground, for semiconductor dies 26 in some embodiments. In addition, or alternatively, the exposed lower surface 36 allows heat to dissipate from heat sink flange 24, and hence semiconductor dies 26.

Molding compound encapsulant 32 may comprise a plastic material or other molding materials as is commonly used in packaged electronic devices and is formed over frame structure 28, heat sink flange 24, semiconductor dies 26, and bond wires 30 during a conventional overmolding process.

Portions of frame structure 28 such as connector section 50 and first section 46 may include notches 70. In this embodiment, notches 70 extend only partially through the material thickness of frame structure 28. However, in alternative embodiments, notches 70 may extend through an entirety of the material thickness of frame structure 28. When semiconductor device 20 is overmolded, encapsulant 30 fills notches 70 to secure molding compound encapsulant 30 to frame structure 28 so that semiconductor device 20 is less likely to delaminate, or separate. In addition, or alternatively, heat sink flange 24 may include lock features 72, such as notches, grooves, extended regions, and so forth. Encapsulant 30 fills or otherwise bonds with these lock features 72 to secure molding compound encapsulant 30 to frame structure 28 so that semiconductor device 20 is less likely to delaminate.

Figure 4:
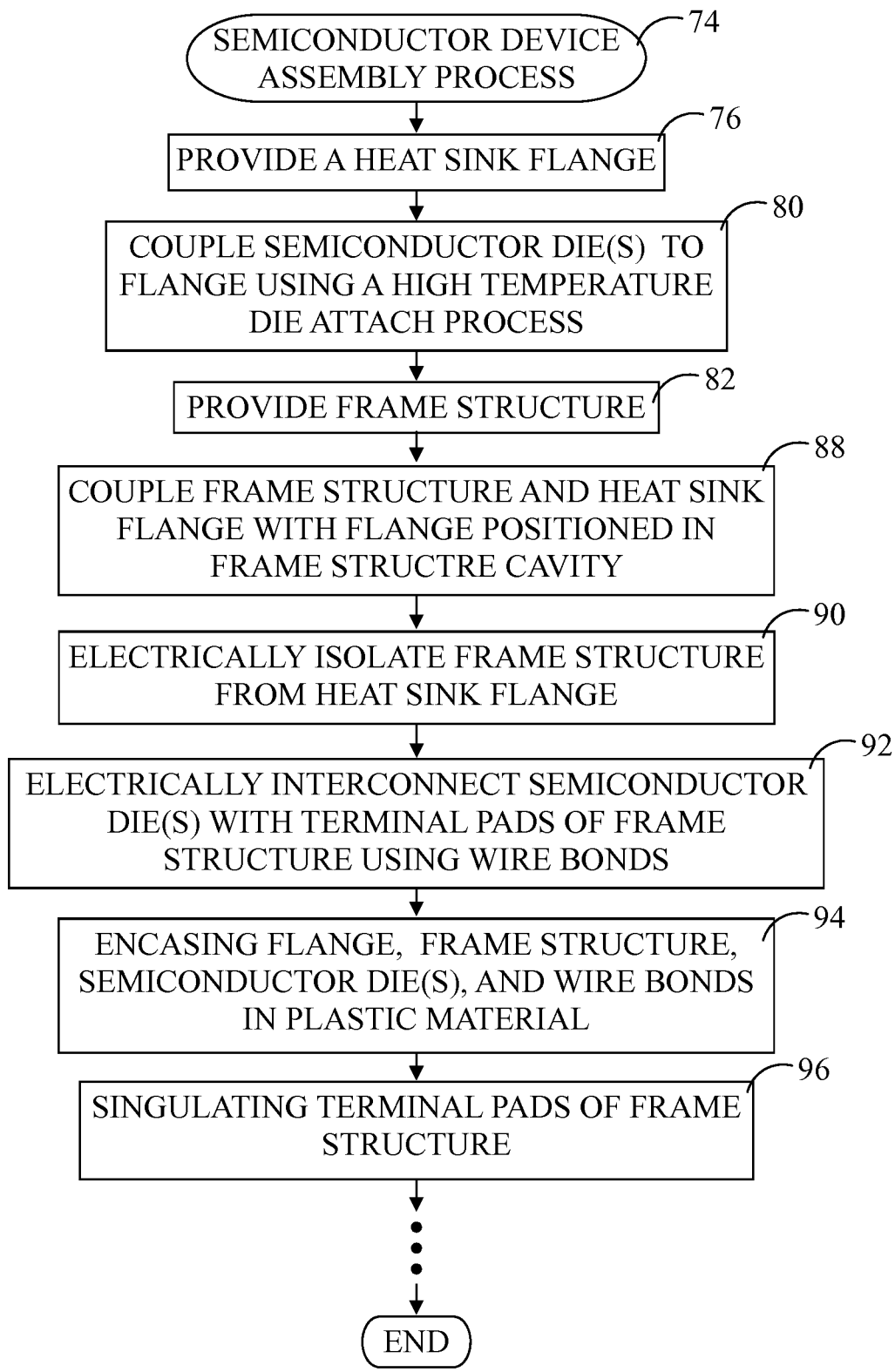
FIG. 4 shows a flowchart of a semiconductor device assembly process in accordance with another embodiment.

Now referring to FIG. 4, FIG. 4 shows a flowchart of a semiconductor device assembly process 74 in accordance with another embodiment. In general, process 74 includes operations for assembling semiconductor device 20.

Figure 5:
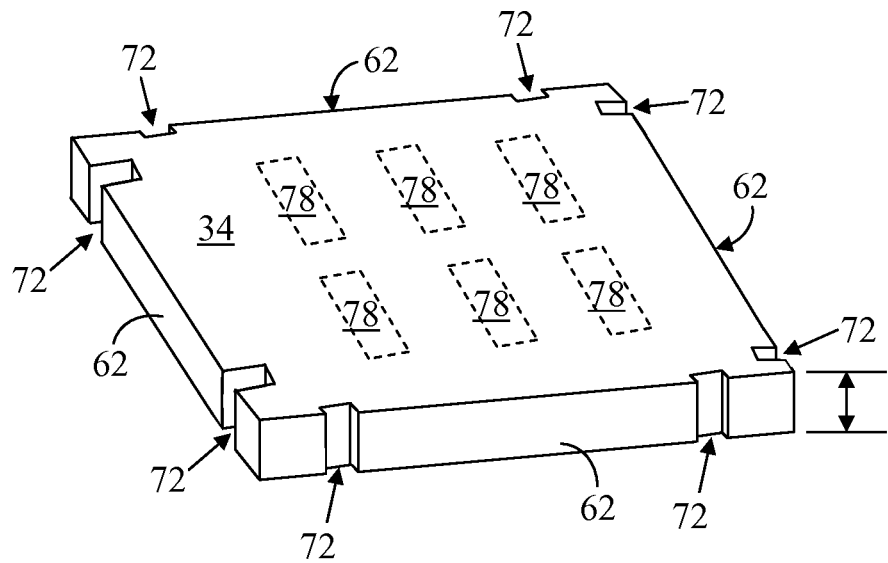
FIG. 5 shows a perspective view of a heat sink flange of the semiconductor device provided at an initial stage of assembly in accordance with the assembly process of FIG. 4.

Semiconductor device assembly process 74 begins with a task 76. At task 76, heat sink flange 24 is provided. Referring to FIG. 5 in connection with task 76, FIG. 5 shows a perspective view of heat sink flange 24 of semiconductor device 20 provided at an initial stage of assembly in accordance with task 76 of assembly process 74. It should be recalled that in an embodiment, flange thickness 38 of heat sink flange 24 is at least thirty mils (762 microns). Heat sink flange 24 may include one or more lock features 72 extending inwardly from lateral sidewalls 62. Lock features 72 may additionally be formed in upper surface 34 or additionally or alternatively in lower surface 36 of heat sink flange 24 as shown in FIG. 3.

Heat sink flange 24 may be formed from copper or a copper laminate material for effective heat dissipation. Only one heat sink flange 24 is shown for simplicity of illustration. In some embodiments, heat sink flange 24 may be a single flange, or die paddle, in an array of interconnected heat sink flanges 24 (not shown), as known to those skilled in the art. Heat sink flange 24 is sized to accommodate one or more semiconductor dies (FIG. 3) in accordance with the particular design of semiconductor device 20 (FIG. 3). In this illustration, locations 78 on upper surface 34 of heat sink flange 24 at which semiconductor dies 26 are to be attached are demarcated by dashed lines. Locations 78 may be selectively plated to provide a portion of upper surface 34 of heat sink flange 24 suitable for a subsequent die attach operation.

Figure 6:
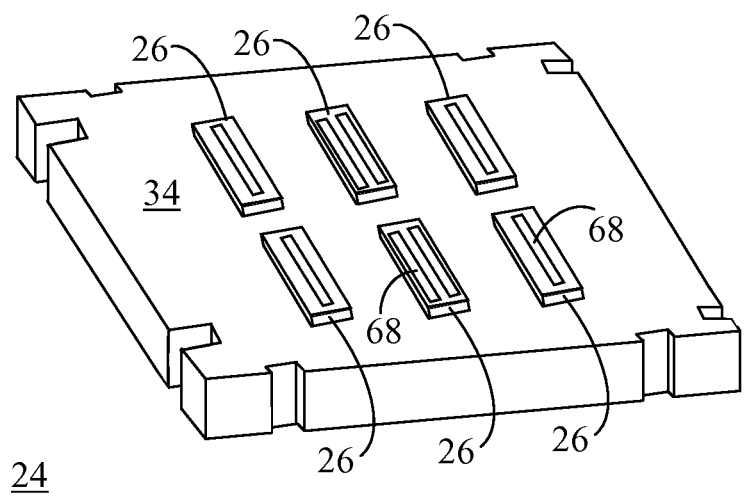
FIG. 6 shows a perspective view of heat sink flange at a subsequent stage of assembly in accordance with the assembly process of FIG. 4.

Referring back to FIG. 4, following task 76, assembly process 74 continues with a task 80. At task 80, semiconductor dies 26 are coupled to heat sink flange 24. Referring to FIG. 6 in connection with task 80, FIG. 6 shows a perspective view of heat sink flange 24 at a subsequent stage of assembly process 74. As shown, a number of semiconductor dies 26 are coupled to upper surface 34 of heat sink flange 24. In an embodiment, semiconductor dies 26 are coupled to heat sink flange 24 using a high temperature die attach process, such as gold-silicon eutectic bonding. Such a high temperature (e.g., greater than four hundred degrees Celsius) may effectively be accomplished due to flange thickness 38 of heat sink flange 24 in excess of thirty mils.

Figure 7:
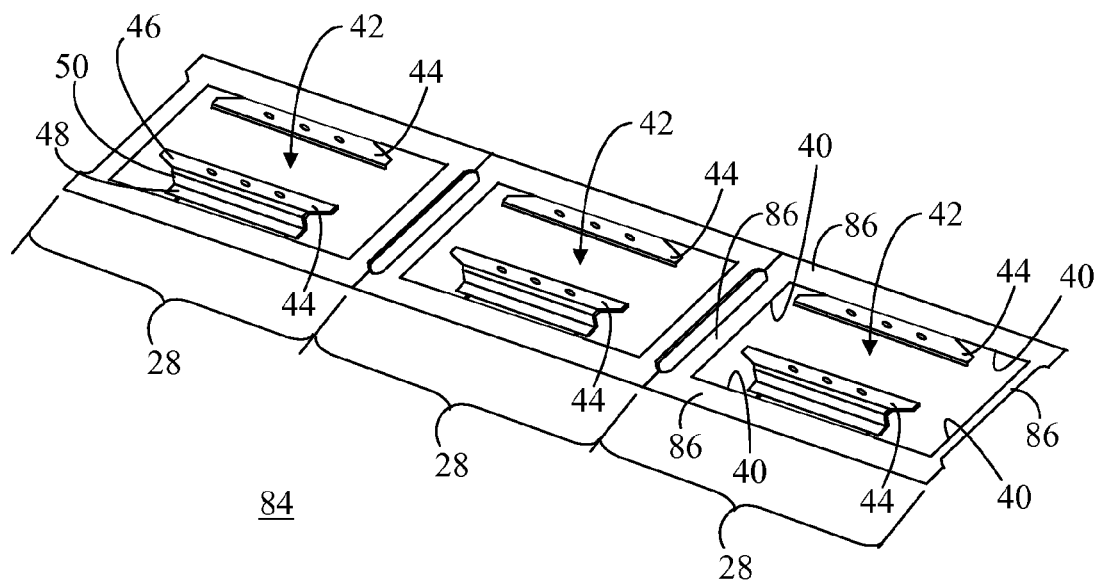
FIG. 7 shows a perspective view of a frame structure panel for frame structure of the semiconductor device provided at a subsequent stage of assembly in accordance with the assembly process of FIG. 4.

Referring back to FIG. 4, following task 80, assembly process 74 continues with a task 82. At task 82, frame structure 28 is provided. Referring to FIG. 7 in connection with task 84, FIG. 7 shows a perspective view of a frame structure panel 84 for frame structure 28 of semiconductor device 20 (FIG. 3) provided at a subsequent stage of assembly in accordance with assembly process 74.

In the illustrative embodiment, frame structure panel 84 is an array of frame structures 28. In this example, frame structure panel 84 is a 3×1 array of frame structures 28. However, in practice, the arrays will generally be larger. Moreover, the array need not have a single row, or the same number of rows as columns.

Each of frame structures 28 within frame structure panel 84 includes perimeter 40 defining cavity 42. As previously mentioned, each cavity 42 is sized and shaped to receive heat sink flange 24 (FIG. 3). In the embodiment shown, perimeter 40 of each frame structure 28 is defined, or circumscribed by tie bars 86 from which terminal pads 44 extend. Frame structure panel 86 has a predefined thickness that is less than flange thickness 38 (FIG. 1), for example, approximately eight mils. However, frame structure panel 84 is preformed such that each of terminal pads 44 is in the folded arrangement of first section 46, second section 48, and connector section 50 interconnecting first and second sections 46 and 48, respectively.

Figure 8:
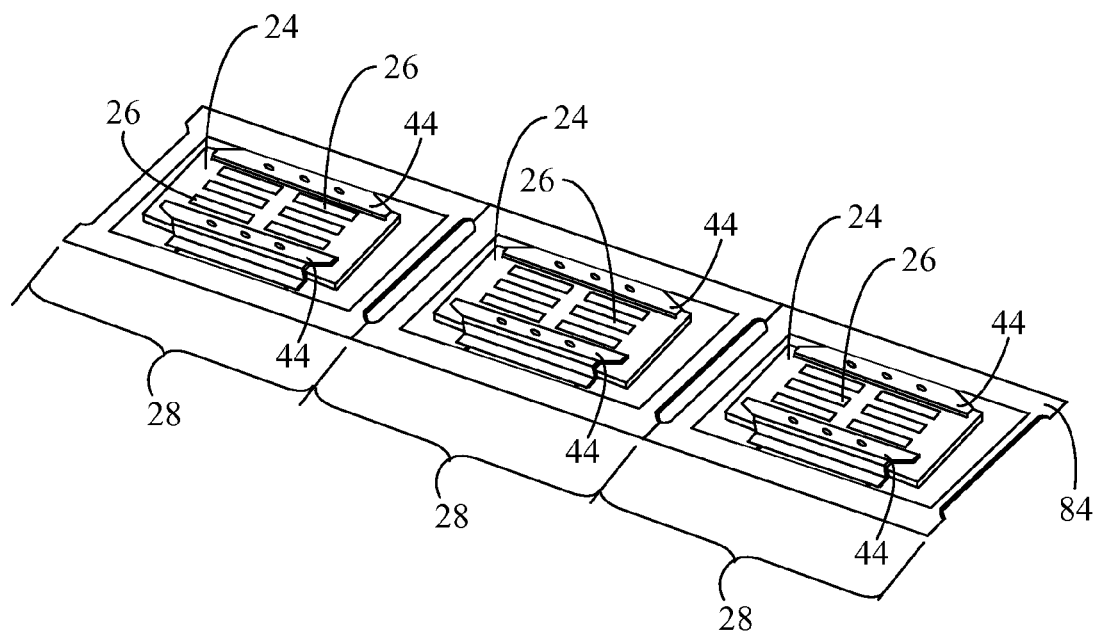
FIG. 8 shows a perspective view of the frame structure panel coupled with a number of heat sink flanges at a subsequent stage of assembly in accordance with the assembly process of FIG. 4.

Returning to FIG. 4, following task 82, assembly process 74 continues with a task 88. At task 88, frame structure 28 is coupled with heat sink flange 24 such that flange 24 is positioned in cavity 42 of frame structure 28. Referring to FIG. 8 in connection with task 88, FIG. 8 shows a perspective view of frame structure panel 84 coupled with a number of heat sink flanges 24 at a subsequent stage of assembly in accordance with assembly process 74. Individual heat sink flanges 24 may be positioned in cavities 42 of frame structures 28. Heat sink flanges 24 can then be staked to, adhered to, or otherwise coupled to frame structures 28. As an example, staking may be accomplished using a high precision mechanical staking process, laser joining process, or spot welding process. In an embodiment, a suitable coupling process is implemented to ensure that the frame structure panel 84 remains or is kept electrically insulated from heat sink flanges 24.

It should be recalled that semiconductor dies 26 were previously bonded to heat sink flanges 24. Thus, semiconductor dies 26 are resident on heat sink flanges 24 when flanges 24 are coupled to frame structures 28. Although heat sink flanges 24 are illustrated as being individual elements, heat sink flanges 24 may be provided as a corresponding array of flanges 24 that mates with frame structure panel 84.

With reference back to FIG. 4, assembly process 74 continues with a task 90 following task 88. At task 90, additional measures may be taken to ensure that frame structure 28 is electrically isolated from heat sink flange 24. By way of example, dielectric material 66 (FIG. 3) may be bonded in gaps 60 and 64 (FIG. 3) between frame structure 28 and heat sink flange 24. In an alternative embodiment, an insulator frame suitable for inclusion with a cap may be formed to ensure electrical isolation. The insulator frame and cap configuration will be discussed below in connection with FIGS. 11 and 12.

Figure 9:
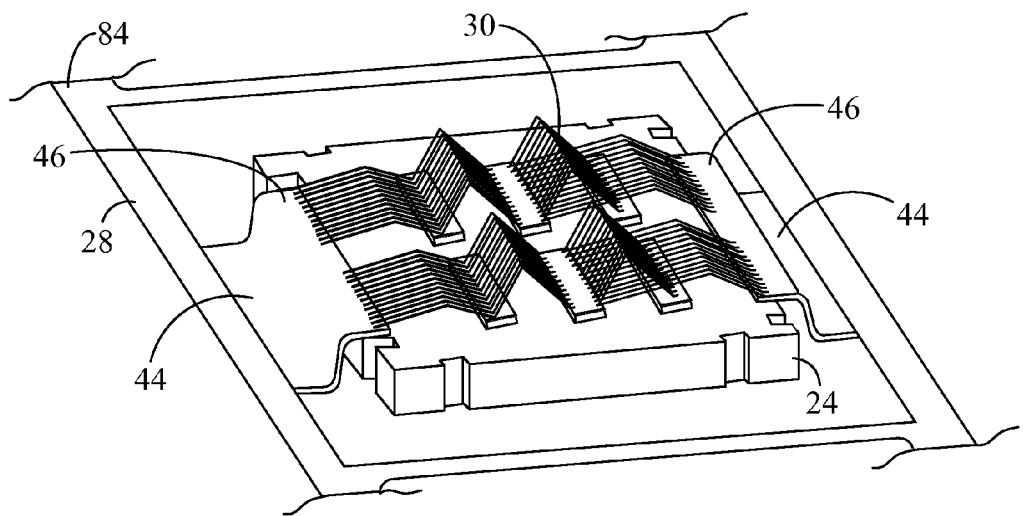
FIG. 9 shows an enlarged perspective view of the heat sink flange and the frame structure at a subsequent stage of assembly in accordance with the assembly process of FIG. 4.

Following task 90, a task 92 is performed. At task 92, semiconductor dies 26 coupled to heat sink flange 28 are electrically interconnected with terminal pads 44 using bond wires 30. Referring to FIG. 9 in connection with task 92, FIG. 9 shows an enlarged perspective view of heat sink flange 24 and frame structure 28 at a subsequent stage of assembly in accordance with the assembly process 74. FIG. 9 depicts only one heat sink flange 24 and frame structure 28 for simplicity of illustration. It should be understood, however, that bond wires 30 may be formed in a batch mode assembly processes while frame structure 28 is interconnected with other frame structure 28 of frame structure panel 84 (FIG. 7). Since upper surface 52 of terminal pads 44 within frame structure 28 overlie at least a portion of heat sink flange 24, bond wires 30 between semiconductor dies 26 and terminal pads 44 are shorter than in prior art configurations thereby decreasing system inductance and enhancing system performance.

In this example, the electrical interconnections, e.g., bond wires 30, are formed utilizing a wire bonding process. The electrical interconnections are formed between various semiconductor dies 26 coupled to heat sink flange 24 and/or between semiconductor dies 26 and terminal pads 44 in accordance with a particular semiconductor device design. Although wire bonding is mentioned herein, electrical interconnections may be formed in alternative embodiments using, for example, tape automated bonding (TAB), ribbon bonding, or any other suitable existing or developing technique for forming the electrical interconnections.

Figure 10:
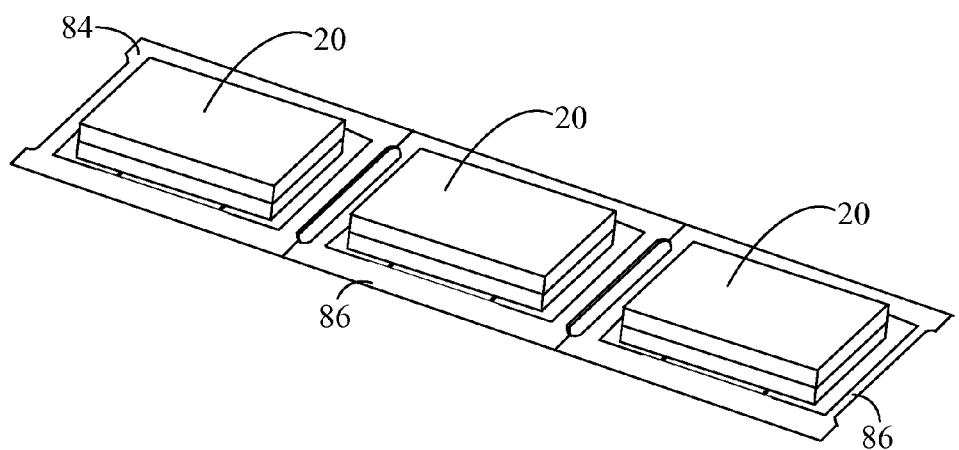
FIG. 10 shows a perspective view of the semiconductor devices at a subsequent stage of assembly in accordance with the assembly process of FIG. 4.

Referring back to FIG. 4, following task 92, semiconductor device assembly process 74 continues with a task 94. At task 94, the assembly that includes heat sink flange 24, frame structure 28, semiconductor dies 26, and bond wires 30 is encased in an encapsulant. In this embodiment, the assembly is overmolded using molding compound encapsulant 32. Referring to FIG. 10 in connection with task 94, FIG. 10 shows a perspective view of semiconductor devices 20 at a subsequent stage of assembly in accordance with the assembly process 74.

Molding compound encapsulant 32 may be a glass-filled epoxy-based plastic that is overmolded over substantially an entirety of heat sink flange 24, frame structure 28, semiconductor dies 26, and bond wires 30. Notches 70 (FIG. 3) and/or lock features 72 (FIG. 3) can serve as mold locks to improve the adhesion of molding compound encapsulant 32 to frame structure 28 (FIG. 3) and heat sink flange 24 (FIG. 3). However, lower surface 36 (FIG. 3) and lower surface 54 (FIG. 3) of each of terminal pads 44 remain exposed from molding compound encapsulant 32 to form the leadless interconnects for semiconductor device 20. Molding compound encapsulant 32 provides protection from environmental conditions for the components of device 20. Additionally, molding compound encapsulant 32 reinforces or improves the strength and durability of semiconductor device 20.

Following task 94, assembly process 74 continues with a task 96. At task 96, terminal pads 44 (FIG. 3) of frame structure 28 are singulated. More particularly, tie bars 86 (FIG. 10) are cut or otherwise removed, so that terminal pads 44 are isolated from one another. Following task 96, multiple leadless surface mount semiconductor devices 20 are produced. Ellipses following task 96 represent subsequent operations that may be performed on semiconductor devices 20, such as inspection, testing, cleaning, and so forth.

Figure 11:
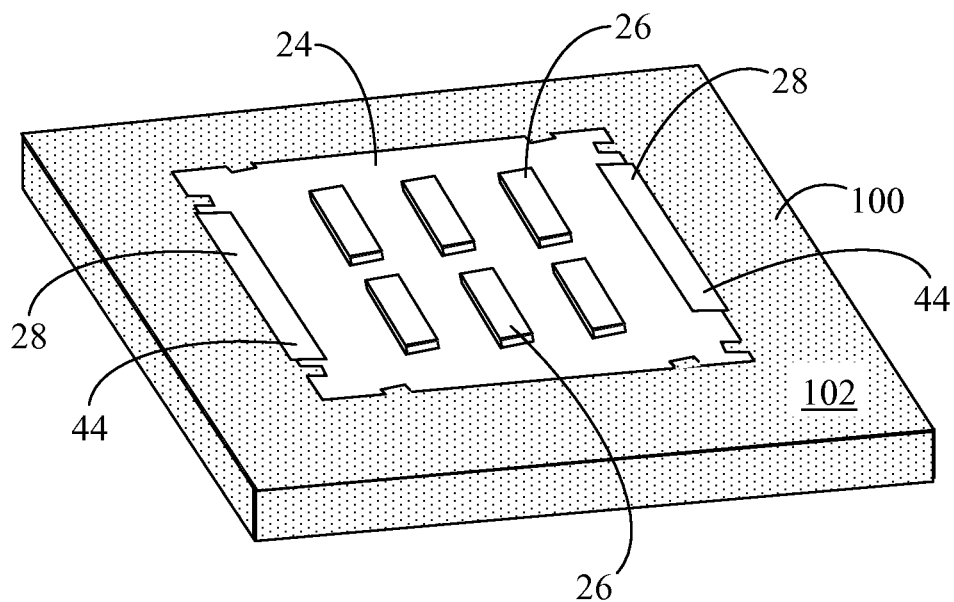
FIG. 11 shows a perspective view of the heat sink flange and the frame structure in accordance with an alternative embodiment of the assembly process.
Figure 12:
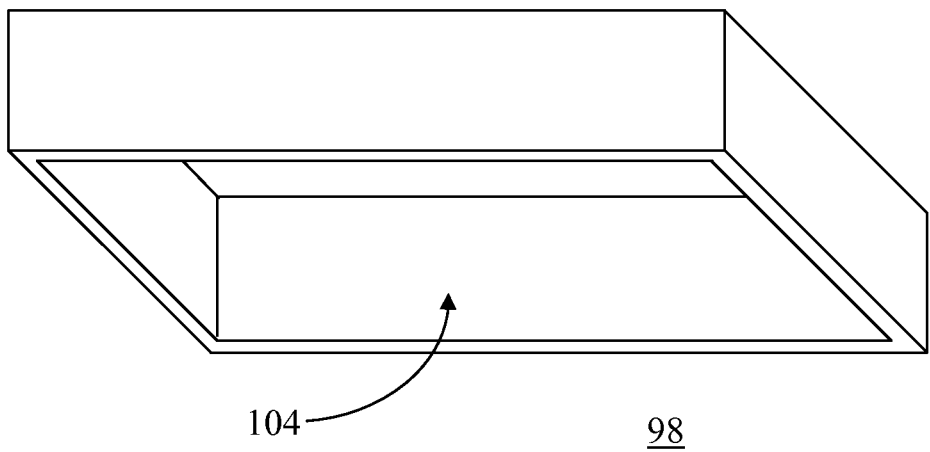
FIG. 12 shows a perspective view of a cap utilized in accordance with the alternative embodiment.

Referring now to FIGS. 11 and 12, FIG. 11 shows a perspective view of heat sink flange 24 and frame structure 28 in accordance with an alternative embodiment, and FIG. 12 shows a perspective view of a cap 98 utilized in accordance with the alternative embodiment. Semiconductor device 20 (FIG. 1) and semiconductor device assembly process 74 (FIG. 4) are described in connection with an overmolded configuration. In some situations, it may be preferential to provide an air cavity in which semiconductor dies 26 reside. Thus, assembly process 74 is readily adapted to provide a capped semiconductor device structure.

In particular, at task 90 (FIG. 4) of assembly process 74 (FIG. 4), frame structure 28 is electrically isolated from heat sink flange 24. In an embodiment, an insulator frame 100 may be formed surrounding frame structure 28 and heat sink flange prior to wire bonding. Insulator frame 100 may be formed from, for example, a molding compound 102 that is allowed to encapsulate a portion of each of heat sink flange 24 and frame structure 28. However, upper surface 34 of heat sink flange 24 and semiconductor dies 26 remain exposed from molding compound 102. Additionally, upper surface 52 of each of terminal pads 44 remain exposed from molding compound 102. Like semiconductor device 20, lower surface 36 (FIG. 3) of heat sink flange 24 and lower surface 54 of each of terminal pads 44 also remain exposed from molding compound 102.

Following electrically interconnecting terminal pads 44 with semiconductor dies 26, as discussed above, cap 98 is coupled to insulator frame 100 using adhesive, laser bonding, or any other suitable technique such that semiconductor dies 26, bond wires 30 (FIG. 3), and terminal pads 44 reside in an interior volume 104 of cap 98.

Figure 13:
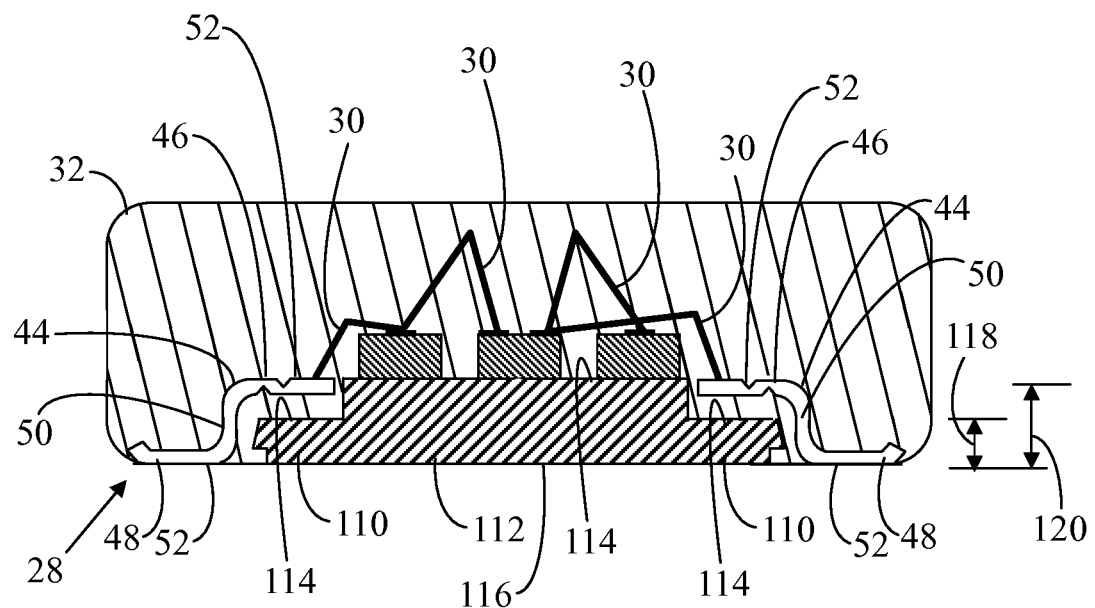
FIG. 13 shows a cross-sectional view of a semiconductor device in accordance with another alternative embodiment.

FIG. 13 shows a cross-sectional view of a semiconductor device 106 in accordance with another alternative embodiment. Like semiconductor device 20, semiconductor device 106 includes frame structure 28 and one or more semiconductor dies 26 suitably interconnected by bond wires 30. Frame structure 28 includes terminal pads 44 arranged in the folded arrangement with first section 46, second section 48, and connector section 50 interconnecting first and second sections 46 and 48, respectively. Semiconductor device 106 may be assembled in accordance with semiconductor device assembly process 74 (FIG. 4) as discussed in detail above.

In accordance with this alternative embodiment, semiconductor device 106 includes a heat sink flange 108 having a peripheral portion 110 and a central portion 112 at least partially surrounded by peripheral portion 110. Each of portions 110 and 112 includes an upper surface 114 and a lower surface 116. Upper surface 114 of peripheral portion 110 is spaced apart from lower surface 116 by a flange thickness 118. Likewise, upper surface 114 of central portion 112 is spaced apart from lower surface 116 by a flange thickness 120 that is greater than flange thickness 118. Lower surface 116 of central portion 112 is coplanar with lower surface 116 of peripheral portion 110. Thus, heat sink flange 108 represents a dual thickness heat sink flange configuration.

Semiconductor dies 26 may be coupled to upper surface 114 of the relatively thicker central portion 112 of heat sink flange 108, and first surface 52 of each of terminal pads 44 may overlie the relatively thinner peripheral portion 110 of heat sink flange 108. Flange thickness 120 of central portion 112 of heat sink flange 108 may be sufficiently thick (e.g., at least thirty mil) to effectively serve as a heat sink for semiconductor dies 26. In addition, implementation of the relatively thinner peripheral portion 110 can result in decreased length of bond wires 30 and/or shorter overall length of connector section 50 of terminal pads 44 interconnecting first and second sections 46 and 48. Accordingly, the dual thickness configuration of heat sink flange 108 enables the implementation of electrically conductive signal paths that may be made even shorter so as to further lower inductance, and thereby further increase system performance.

In summary, embodiments set forth herein entail a packaged leadless surface mount semiconductor device that may be used for high power applications and an assembly process for such a packaged device. The packaged semiconductor device includes a relatively thick heat sink flange and a separate frame structure. The frame structure is pre-formed with bent terminal pads. The semiconductor dies can be attached to the heat sink flange using a high temperature die attach process. The frame structure can subsequently be combined with the heat sink flange so that the lower surface of the heat sink flange and a lower surface of the terminal pads are in coplanar alignment, and so that an upper surface of the terminal pads overlies the heat sink flange. Electrical interconnects between the semiconductor dies and the upper section of the terminal pads are formed after the high temperature die attach process. The electrical interconnects are short due to the overlying configuration of the terminal pads so as to lower inductance, and thereby increase system performance. The structure can then be entirely encapsulated so that the lower surface of the heat sink flange and the lower surface of the terminal pads remain exposed from the encapsulant.

Although the preferred embodiments of the invention have been illustrated and described in detail, it will be readily apparent to those skilled in the art that various modifications may be made therein without departing from the spirit of the invention or from the scope of the appended claims. That is, it should be appreciated that the exemplary embodiments are only examples, and are not intended to limit the scope, applicability, or configuration of the invention.

What is claimed is:

1. A packaged leadless semiconductor device comprising:
a heat sink flange having an upper surface and a lower surface spaced apart by a flange thickness;
a semiconductor die physically coupled to said upper surface of said heat sink flange;
a frame structure having a perimeter that defines a cavity and terminal pads surrounding said cavity, each of said terminal pads including a first surface and a second surface, said first surface being spaced apart from said second surface by a distance that is greater than said flange thickness, and said heat sink flange is positioned in said cavity such that said lower surface of said heat sink flange and said second surface of each of said terminal pads are in coplanar alignment, and at least a portion of said first surface of said each of said terminal pads overlies said upper surface of said heat sink flange;
interconnects electrically connecting said semiconductor die with said first surface of said terminal pads; and
an encapsulant substantially encasing said frame structure, said heat sink flange, said semiconductor die, and said interconnects with at least said lower surface of said heat sink flange and said second surface of said each of said terminal pads remaining exposed from said encapsulant.

2. A packaged leadless semiconductor device as claimed in claim 1 wherein said first surface is spaced apart from said upper surface of said heat sink flange by a gap, and said semiconductor device further comprises a dielectric material residing in said gap.

3. A packaged leadless semiconductor device as claimed in claim 1 wherein said each of said terminal pads comprises a folded arrangement having a first section, a second section, and a connector section interconnecting said first and second sections, said first surface being formed on a top side of said first section, and said second surface being formed on an underside of said second section.

4. A packaged leadless semiconductor device as claimed in claim 3 wherein said connector section is spaced apart from a lateral sidewall of said heat sink flange by a gap, and said semiconductor device further comprises a dielectric material residing in said gap.

5. A packaged leadless semiconductor device as claimed in claim 3 wherein said second section is outwardly laterally displaced away from said heat sink flange relative to said first section.

6. A packaged leadless semiconductor device as claimed in claim 1 wherein said frame structure is pre-formed with bent ones of said terminal pads.

7. A packaged leadless semiconductor device as claimed in claim 1 wherein said flange thickness is a first thickness, and said upper surface of said heat sink flange comprises:
a first portion having said upper surface and said lower surface, said upper surface of said first portion being spaced apart from said lower surface by said first thickness; and
a second portion having said upper surface and said lower surface, said upper surface of said second portion being spaced apart from said lower surface by a second thickness that is greater than said first thickness, said lower surface of said second portion being coplanar with said lower surface of said first portion, and said at least a portion of said first surface of said each of said terminal pads overlies said upper surface of said first portion of said heat sink flange.

8. A packaged leadless semiconductor device as claimed in claim 1 wherein said flange thickness of said heat sink flange is at least thirty mils.

9. A packaged leadless semiconductor device as claimed in claim 1 wherein said semiconductor die is coupled to said heat sink flange using a high temperature die attach process.

10. A packaged leadless semiconductor device as claimed in claim 1 wherein said encapsulant is a molding compound encapsulant covering said heat sink flange, said frame structure, said semiconductor die, and said interconnects.

11. A packaged leadless semiconductor device as claimed in claim 1 wherein said encapsulant comprises:
an insulator frame surrounding said frame structure and said heat sink flange; and
a cap coupled with said insulator frame, said cap including an interior volume to provide an air cavity in which said semiconductor die resides.

12. A packaged leadless semiconductor device as claimed in claim 1 wherein said each of said terminal pads of said frame structure includes a connector section interposed between said first and second surfaces, said connector section having notches formed therein, and said encapsulant is a molding compound encapsulant configured to fill said notches to secure said molding compound encapsulant to said frame structure.

13. A packaged leadless semiconductor device as claimed in claim 1 wherein at least one of said upper and lower surfaces and a lateral sidewall of said heat sink flange includes lock features formed therein, and said encapsulant is a molding compound encapsulant configured to fill said lock features to secure said molding compound encapsulant to said heat sink flange.

14. A packaged leadless semiconductor device comprising:
a heat sink flange having an upper surface and a lower surface spaced apart by a flange thickness, said flange thickness being at least thirty mils;
a semiconductor die physically coupled to said upper surface of said heat sink flange;
a frame structure having a perimeter that defines a cavity and terminal pads surrounding said cavity, each of said terminal pads including a folded arrangement having a first section, a second section, and a connector section interconnecting said first and second sections, wherein a first surface is formed on a top side of said first section, and a second surface is formed on an underside of said second section, said first surface being spaced apart from said second surface by a distance that is greater than said flange thickness, and said heat sink flange is positioned in said cavity such that said lower surface of said heat sink flange and said second surface of each of said terminal pads are in coplanar alignment, and at least a portion of said first surface of said each of said terminal pads overlies said upper surface of said heat sink flange;
interconnects electrically connecting said semiconductor die with said first surface of said terminal pads; and
an encapsulant encasing said frame structure, said heat sink flange, said semiconductor die, and said interconnects with at least said lower surface of said heat sink flange and said second surface of said each of said terminal pads remaining exposed from said encapsulant.

15. A packaged leadless semiconductor device as claimed in claim 14 wherein said first section is spaced apart from said upper surface of said heat sink flange by a first gap, said connector section is spaced apart from a lateral sidewall of said heat sink flange by a second gap, and said semiconductor device further comprises a dielectric material residing in said first and second gaps.

16. A packaged leadless semiconductor device as claimed in claim 14 wherein said semiconductor die is coupled to said heat sink flange using a high temperature die attach process.

17. A packaged leadless semiconductor device as claimed in claim 14 wherein said connector section has notches formed therein, and said encapsulant is a molding compound encapsulant configured to fill said notches to secure said molding compound encapsulant to said frame structure.

18. A packaged leadless semiconductor device comprising:
- a heat sink flange having an upper surface and a lower surface spaced apart by a flange thickness, said flange thickness being at least thirty mils;
- a semiconductor die physically coupled to said upper surface of said heat sink flange;
- a frame structure having a perimeter that defines a cavity and terminal pads surrounding said cavity, said frame structure being pre-formed with bent ones of said terminal pads, each of said terminal pads including a first surface and a second surface, said first surface being spaced apart from said second surface by a distance that is greater than said flange thickness, and said heat sink flange is positioned in said cavity such that said lower surface of said heat sink flange and said second surface of each of said terminal pads are in coplanar alignment, and at least a portion of said first surface of said each of said terminal pads overlies said upper surface of said heat sink flange;
- interconnects electrically connecting said semiconductor die with said first surface of said terminal pads; and
- an encapsulant substantially encasing said frame structure, said heat sink flange, said semiconductor dies, and said interconnects with at least said lower surface of said heat sink flange and said second surface of said each of said terminal pads remaining exposed from said encapsulant.

19. A packaged leadless semiconductor device as claimed in claim 18 wherein said flange thickness is a first thickness, and said upper surface of said heat sink flange comprises:
- a first portion having said upper surface and said lower surface, said upper surface of said first portion being spaced apart from said lower surface by said first thickness; and
- a second portion having said upper surface and said lower surface, said upper surface of said second portion being spaced apart from said lower surface by a second thickness that is greater than said first thickness, said lower surface of said second portion being coplanar with said lower surface of said first portion, and said at least a portion of said first surface of said each of said terminal pads overlies said upper surface of said first portion of said heat sink flange.

20. A packaged leadless semiconductor device as claimed in claim 18 wherein said each of said terminal pads of said frame structure includes a connector section interposed between said first and second surfaces, said connector section having notches formed therein, and said encapsulant is a molding compound encapsulant configured to fill said notches to secure said molding compound encapsulant to said frame structure.

* * * * *